(12) United States Patent
Moore

(10) Patent No.: US 7,463,178 B2
(45) Date of Patent: Dec. 9, 2008

(54) RECONFIGURABLE SIGNAL PROCESSOR FOR RAW DATA PATTERNS

(76) Inventor: Gary W. Moore, 6904 Chinook Dr., Austin, TX (US) 78736

( * ) Notice: Subject to any disclaimer, the term of this patent is extended or adjusted under 35 U.S.C. 154(b) by 100 days.

(21) Appl. No.: 11/623,431

(22) Filed: Jan. 16, 2007

(65) Prior Publication Data

US 2008/0169954 A1   Jul. 17, 2008

(51) Int. Cl.
  *H03M 1/12*   (2006.01)
(52) U.S. Cl. ....................................... 341/155; 341/141
(58) Field of Classification Search ................. 341/155, 341/141, 156, 118, 120
  See application file for complete search history.

(56) References Cited

U.S. PATENT DOCUMENTS

| 4,612,531 | A | * | 9/1986 | Dingwall et al. ............. 341/156 |
| 5,765,012 | A | * | 6/1998 | Wilkinson et al. ............ 712/16 |
| 6,498,576 | B1 | * | 12/2002 | Tian et al. .................. 341/155 |
| 6,618,547 | B1 | * | 9/2003 | Peters et al. .................. 386/52 |
| 7,046,180 | B2 | * | 5/2006 | Jongsma et al. ............. 341/141 |

* cited by examiner

*Primary Examiner*—Rexford Barnie
*Assistant Examiner*—Joseph Lauture
(74) *Attorney, Agent, or Firm*—Anderson Law Group PLLC; Margaret M Anderson

(57) ABSTRACT

A reconfigurable signal processor receives continuously changing signal elements for analyzing signal patterns through a conversion process further defined by a coarse sample reference and a fine sample reference. Receiving the plurality of signal elements to produce raw data status representing specific signal elements, the coarse sample reference is used to sub-divide raw data patterns into a predetermined number of equal parts. The fine sample reference is used to define specific variations or gaps between the predetermined number of equal sub-divided parts for data patterns to trigger status updates in a bit-mapped memory array with a bit pattern mutually exclusive of logic one bit states. A decoder is used to convert sub-divided data patterns into a digital bit pattern of mutually exclusive logic one states which is stored in the memory away when triggered by specific variations or gaps between the predetermined number of equal sub-divided parts for signal data patterns.

35 Claims, 7 Drawing Sheets

RECONFIGURABLE SIGNAL PROCESSOR FOR RAW DATA PATTERNS

TECHNICAL FIELD

The present application relates generally to a reconfigurable signal processor for operating on raw data patterns.

BACKGROUND OF THE INVENTION

In the vast array of electrical properties that constitute a signal, it is impractical to employ one electrical interface that accepts every signal for processing. Instead, signal detectors and signal converters are used in specific ways to interface specific signals for specific processes. Comparators are devices used to judge one input against another to produce an output. In the domain of logical ones and zeros, a process judges one digital word against another to yield an output signifying that one input is GREATER than, EQUAL, or LESS than the other. For analog signals however, a comparator more accurately refers to a level detection device, or biased differential amplifier, that derives an output by comparing a known reference value to a signal source. Comparators often convert analog signals into digital values through various prior art techniques frequently employed as intermediate elements in a system between an input and a process to interpret signals. Although comparators represent distinct functions within digital or analog processes, both arrangements in a plurality of logical outputs produce raw data elements used to facilitate other circuits, devices, or processes.

U.S. Pat. No. 7,046,180 filed by Jongsma, et al., granted May 16, 2006, presents a system that requires a specifically configured analog encoding system using a combination of scaling, inversion and level shifting to produce non-overlapping encoded values with unique ranges for detecting specific fault conditions while processing a plurality of decoded data elements for quantifying signals. Generated across a resistive network switched from a control circuit, course and fine reference voltages are used to bias an analog-to-digital converter for separating data elements from non-overlapping encoded signal values. Decoded data elements are then compared to a sequence of stored reference values in memory to determine actual signal and fault conditions. Before processing the original source signal, encoded non-overlapping ranges have to be converted from scaling, inversion and level shifting back into intelligible signal or data elements. The process presented requires both an encoder and a decoder to implement requiring multiple analog reference voltages to achieve.

Utilizing scaling, inversion and level shifting techniques involve additional processes separate and distinct from techniques generally considered for simply converting signals from analog to digital values. Although the system produces some benefit for identifying specific fault conditions, it should be obvious to one of ordinary skill in the art that multiple conversions are needed to first encode a signal into non-overlapping values at one stage of a conversion process and then reproduce the original signal in digital form for further processing at another. This two stage approach constitutes more components and/or more process time than simply converting signals from analog to digital values.

Furthermore, utilizing reference voltages to decompress or separate data elements from encoded values introduce accuracy and tolerance issues requiring the use of more expensive components such as precision voltage reference generators and/or precision resistive voltage dividers. Switching methods described for generating multiple voltage references are particularly sensitive to temperature changes which can have an appreciable affect on both reference baseline values and decompressed data elements. Moreover, utilizing a sequence of unique values stored in memory for determining signal elements also contributes to slower response time and memory consumption.

An integrated circuit is presented in U.S. Pat. No. 7,057,422 filed by Berg, granted on Jun. 6, 2006, that regulates the operating point of an external circuit through the use of an analog to digital conversion process. The approach utilizes the output of an analog comparator to control the count direction of clock cycles in the first of two counters while advancing the count of the second counter to vary voltage levels used by the analog comparator to judge against a voltage reference in a conversion process. The content of the first counter represents a data conversion value that is then locked in from further changes allowing stable control over voltage levels affecting the operation of the analog comparator. A locking circuit that isolates electrical chatter enhances a common tracking ADC conversion process or logic "racing" otherwise produced by count direction changes. The locking circuit inherently provides some intrinsic stability against signal transients and noise. Any stability gained against signal transients and noise however, is a strictly incidental benefit of the locking circuit's performance to remove logic racing from the first counter tracking the analog converter's output. To preserve the highest possible resolution of the circuit, it would be reasonable to lock in the value of the first counter just prior to (or just after) a change in count direction. Locking in the value of the first counter accounts for one (least significant) bit of a data word produced by the conversion process for protection against transient signals and noises. In a 2-bit word, for example, the protection offered by a circuit would be limited to one fourth of the signal magnitude. Using an 8-bit word for higher resolution would effectively render the protection against transient signals and noises useless.

What is needed is a system to apply a filtering process that would eliminate the need for logic comparisons between source and reference signals and a method to produce, store, and retrieve specific information based upon a configuration of re-definable filter variables. The filtering process could be used to extract undesirable elements from a reference signal to provide protection against transient signals and noises while at the same time increasing the sensitivity to small signal changes. The process could also be used to extract desirable signal elements for characterizing a digital pattern, an analog value, signal status, or the detection of specific signal changes. Moreover, a system is needed to organize information for immediate access by internal and external processes reliant upon configurable aspects from specific signal sources.

SUMMARY

A method for processing a plurality of data elements is provided in accordance with an embodiment and includes but is not limited to receiving the plurality of data elements; decoding the plurality of data elements in a decoder to produce a digital pattern of mutually exclusive logic ones; receiving a coarse sample reference and a fine sample reference and the digital pattern of mutually exclusive logic ones for storage in a memory array; and processing the data elements to provide an output independent of a decompression process. In one embodiment, the receiving of the plurality of data elements is via an analog to digital converter configured to provide a digital representation of the plurality of continuously changing analog signal data elements to the decoder.

In an embodiment the fine sample reference and the coarse sample reference can be re-definable to provide independent control over a number of observable signal elements and to provide independent control over the level of change that must be observed before detection can occur.

In another embodiment, the memory array includes registers for holding the coarse sample reference and the fine sample reference and the plurality of data elements where the coarse sample reference is used as a denominator to a mathematical divider, the fine sample reference is used to detect the remainder of said divider for observing small signal changes, and the plurality of data elements demultiplexed in a decoder from the quotient of said mathematical divider in a digital pattern of mutually exclusive logic ones is used to characterize a signal source.

In a further embodiment, the method includes producing a memory write pulse when a mathematical remainder of a division process is greater than the fine sample reference to store a signal status representing a digital signal source pattern for the plurality of data elements.

In one embodiment addressing one or more memory locations in the memory array in sequence with the plurality of data elements to synchronize digital inputs with a signal status stored in the memory array. Optionally, the addressing the one or more memory locations in the memory array in sequence can be via a counter coupled to the memory array.

The method can optionally further include enabling real-time probing of signal status of the plurality of data elements via selecting a memory location containing a data element from the plurality of data elements associated with the received data elements.

In one embodiment, the method can include receiving one or more additional sample references to expand a reference relationship between the coarse sample reference and the fine sample reference.

Another embodiment is directed to a data processor, which includes but is not limited to an a decoder configured to receive a plurality of changing digital signals; a control circuit coupled to the analog to digital converter, the memory circuit and configured to receive the coarse sample reference and the fine sample reference, and one or more of an address, data and/or control signals, the control circuit configured to process data to provide an output independent of a decompression process; a memory circuit coupled to the decoder, the memory circuit configured to receive a coarse sample reference and a fine sample reference and the digital pattern of mutually exclusive logic ones; and a the decoder configured to provide a digital pattern of mutually exclusive logic ones. In addition to the foregoing, other method aspects are described in the claims, drawings, and text forming a part of the present application.

Another embodiment is directed to a data processor to receive a plurality of changing digital patterns from a digital signal source of logic ones and zeros or from a plurality of changing digital signals; the memory circuit and configured to receive the coarse sample reference and the fine sample reference, and one or more of an address, data and/or control signals, the control circuit configured to process data patterns from a signal source control circuit coupled to the analog to digital converter, the memory circuit and configured to receive the coarse sample reference and the fine sample reference, and one or more of an address, data and/or control signals, the control circuit configured to process data to provide an output independent of a decompression process; a memory circuit coupled to the decoder, the memory circuit configured to receive a coarse sample reference and a fine sample reference and the digital pattern of mutually exclusive logic ones; and a decoder receiving a plurality of changing digital patterns, the decoder configured to provide a digital pattern of mutually exclusive logic ones. In addition to the foregoing, other method aspects are described in the claims, drawings, and text forming a part of the present application In one aspect, an embodiment is directed to a data co-processor including but not limited to a decoder configured to provide a digital pattern of mutually exclusive logic ones; a memory circuit coupled to the decoder, the memory circuit configured to receive a coarse sample reference and a fine sample reference and the digital pattern of mutually exclusive logic ones; and a control circuit coupled to the memory circuit and configured to receive the coarse sample reference and the fine sample reference, and one or more of an address, data and/or control signals, the control circuit configured to process data received from a system bus in a computer system to provide an output independent of a decompression process.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer. In addition to the foregoing, other system aspects are described in the claims, drawings, and text forming a part of the present application. In addition to the foregoing, other aspects are described in the claims, drawings, and text forming a part of the present application. For example, various other method, system, computer program product, and/or transferable device aspects are set forth and described in the text (e.g., claims and/or detailed description) and/or drawings of the present application.

The foregoing is a summary and thus contains, by necessity, simplifications, generalizations and omissions of detail; consequently, those skilled in the art will appreciate that the summary is illustrative only and is NOT intended to be in any way limiting. Other aspects, features, and advantages of the devices and/or processes and/or other subject described herein will become apparent in the text set forth herein.

BRIEF DESCRIPTION OF THE DRAWINGS

A better understanding of the subject matter of the application can be obtained when the following detailed description of the disclosed embodiments is considered in conjunction with the following drawings, in which.

DETAILED DESCRIPTION OF THE DRAWINGS

Figure 1:
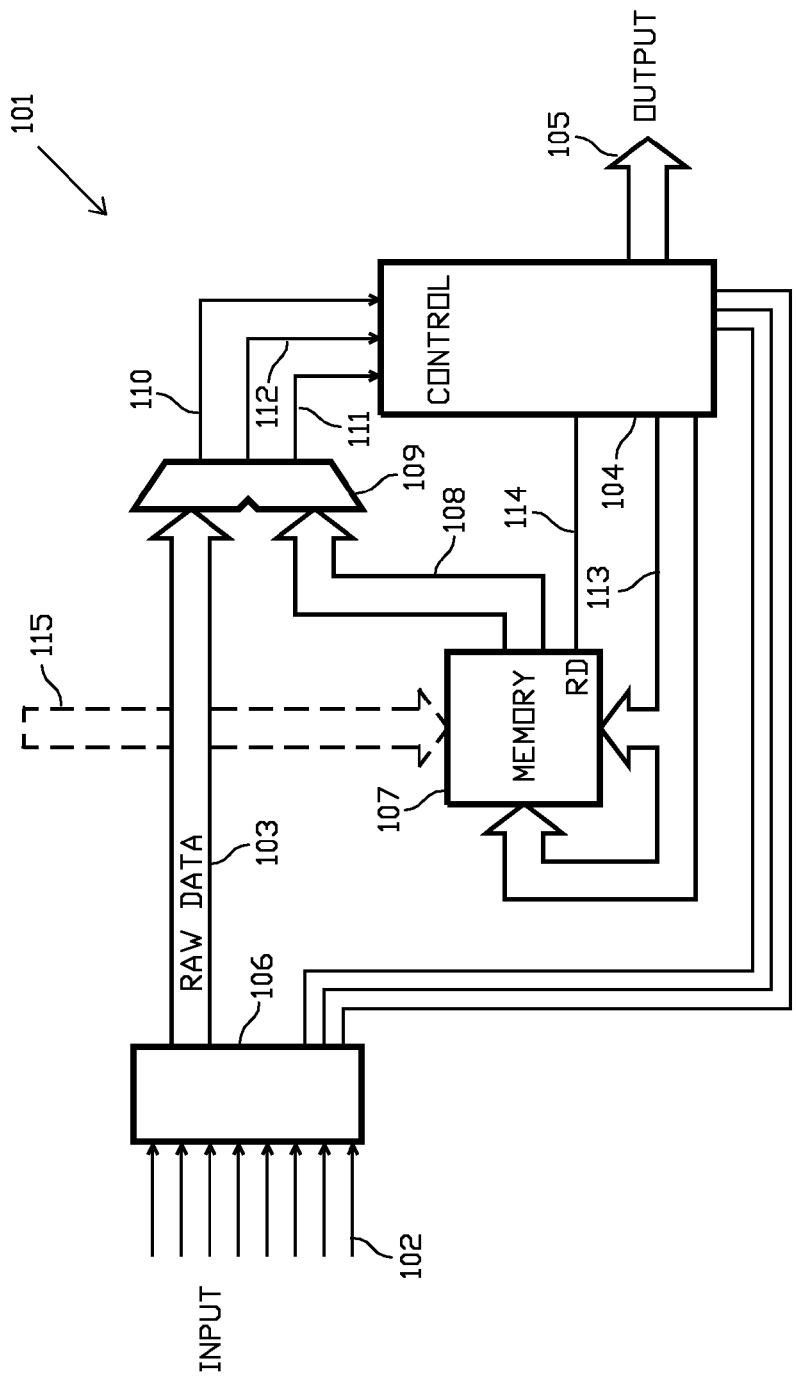
FIG. 1, labeled "prior art", illustrates a Prior Art signal converter system used to detect analog signal changes.

In the description that follows, the subject matter of the application will be described with reference to acts and symbolic representations of operations that are performed by one or more computers, systems, and the like unless indicated otherwise. As such, it will be understood that such acts and operations, which can be referred to as being computer-executed, include the manipulation by the processing unit of the computer of electrical signals representing data in a structured form. This manipulation transforms the data or maintains it at locations in the memory system of the computer that reconfigures or otherwise alters the operation of the computer in a manner well understood by those skilled in the art. The data structures where data is maintained can include physical locations of the memory that have particular properties defined by the format of the data. However, although the subject matter of the application is being described in the foregoing context, it is not meant to be limiting as those of skill in the art will appreciate that some of the acts and operations described hereinafter can also be implemented in hardware, software, and/or firmware and/or some combination thereof.

In a system employing signal detectors and converters, a control circuit manages the flow and timing of signals to produce some useful output based upon predefined algorithms. In an analog to digital converter for example, a conversion process produces data values representing the magnitude of a signal. Other circuits however, in a plurality of logical ones and zeros, contain digital elements of a process representing useful information in the form of raw data directed by a control circuit. In a signal process system, it would be advantageous to collect these data values from a memory queue rather than managing signal detector and converter circuits from the control circuit. From a process perspective, less time could be spent acquiring signal data while increasing the focus on generating more timely outputs. With advancements in microprocessor technology, a control circuit, an analog to digital converter, and memory reside within a single Integrated Circuit (IC) chip that could be used primarily for data acquisition. Due to the number of signal exchanges still required between physical components to transfer data, limited improvements offered by a single chip approach may not offset the increase in cost for implementation without some further advantage. The most obvious approach to reducing signal exchanges within a system is to compress the data into smaller signal elements. This could be accomplished through various processes but once received in its compressed form, the data would need to be decompressed to be of some use. One advantage could be realized if data could be stored, retrieved, and processed in its compressed form to eliminate the decompression process entirely. Also, it would be advantageous to retrieve specific data elements while ignoring others. One way this could be accomplished is to store compressed data in a bit-mapped memory array so that rows and columns in a signal array each have specific attributes that can be accessed quickly and efficiently. Furthermore, it would be of significant use to employ a process means to configure signal elements within a bit-mapped array that could be redefined for specific signal attributes. Moreover, it would be of further use to control the level at which a signal is either detected or filtered.

Furthermore, in a signal process system, it would be of further benefit to accept a broader array of signals within a single process. For this approach to work however, some mechanism would be needed to normalize signals for establishing common references across different types of signals for signal compatibility. This could be accomplished with a re-definable reference that would associate specific signals with specific attributes. Also, to stabilize signals with some degree of protection against electrical noise and interference, a mechanism would also be needed to receive specific process information for controlling protection levels for stabilization purposes. This approach could also be used to control detection levels down to the character level in an information processing system or act as a filter in a control system. As single chip microprocessors have advanced to include the elements of a processing system, it would be of further benefit to network a plurality of these chips into a singular or plurality of systems that could access bit-mapped memory directly or other output forms.

Common hardware components are represented in FIGS. 1-6 to convey the flow of signals in a system otherwise processed from software code. While some concepts presented herein depict specific hardware components, their functions may also be generated in software code executed from a control system in both a singular or plurality of devices without deviating from preferred concepts of the present invention.

FIG. 1 illustrates a prior art signal converter system for analog signal detection. An analog system 101 receives continuously changing analog signals 102 from an external signal source. The analog signals can represent a voltage indicating pressure, temperature, distance, or the like. A control circuit 104, typically a microprocessor, is used to orchestrate the flow of various signals through a system of processes to produce some useful output 105. Data parameters 115 representing specific levels and ranges are initially loaded in memory 107 as signal references. An analog-to-digital converter 106 produces a digital magnitude 103 representing an analog signal source 102 that is applied to one input of a digital comparator 109. Meanwhile in a memory read cycle, a control circuit 104 generates a memory location address 113 and read pulse 114 to access preloaded reference data 108 for the other input of the comparator 109. In a data compare cycle judging input data against reference data, the comparator 109 indicates to the control circuit 105 that the magnitude 103 of an analog signal 102 is either greater than 111, less than 110, or equal 112 to the reference values 108 stored in memory 107. The control circuit 104 may produce some useful output 105 based upon initial results. However, repetitive memory read and data compare cycles are used to detect specific signal levels and ranges through preloaded references in memory. Contingent upon matching digital patterns between magnitude 103 values and reference data 108, a control circuit 104 inevitably generates some useful output 105.

Figure 2:
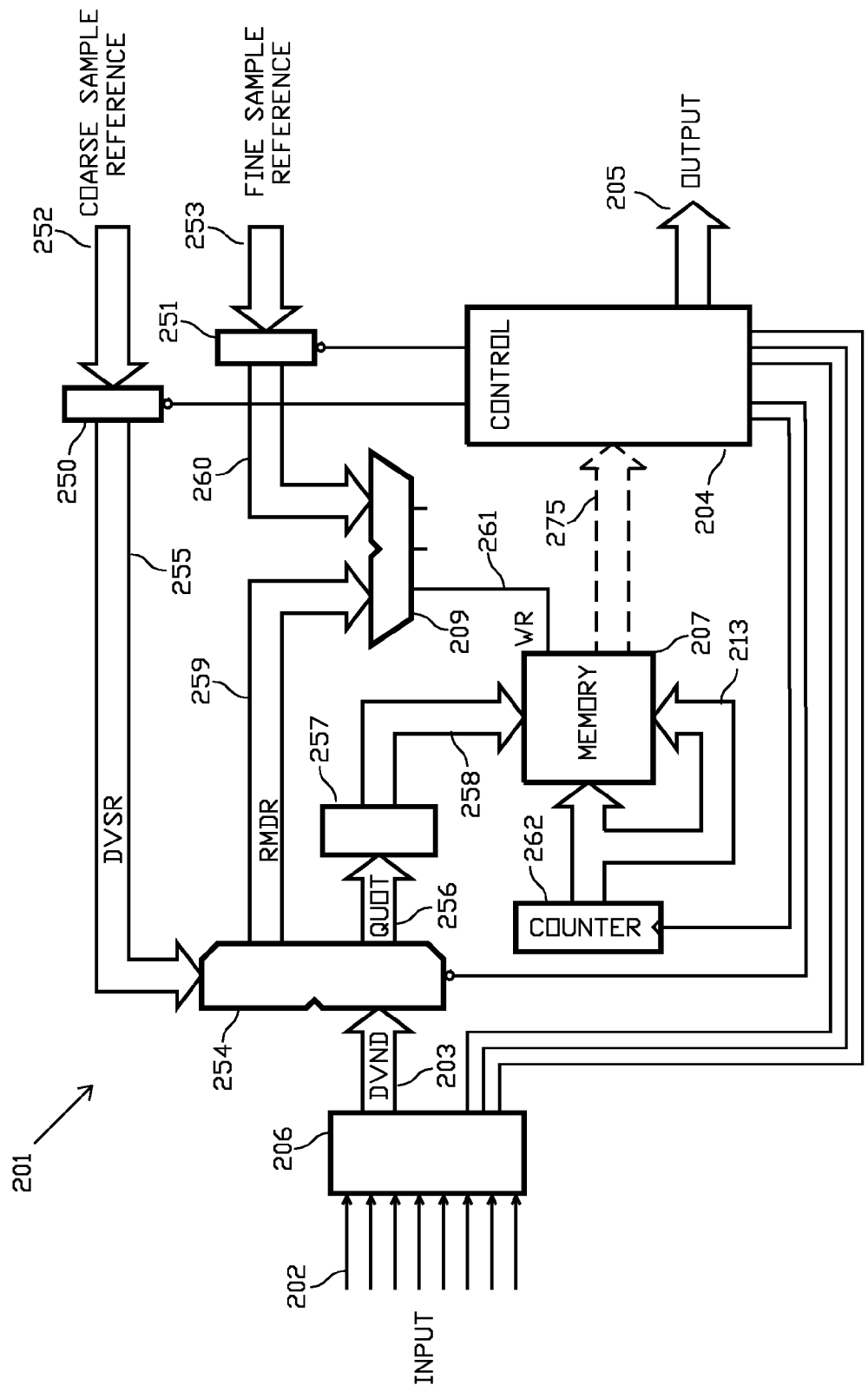
FIG. 2 illustrates of a signal converter system that employs a configuration of re-definable variables to detect analog signal changes in accordance with embodiments of the present invention.

FIG. 2 illustrates embodiments of a signal converter system for analog signal detection with re-definable variables to provide independent control over the number of detectable elements of a signal and the level of change that can be observed before signal detection can occur. System 201 receives continuously changing analog signals through an analog to digital converter (ADC) 206 from external devices that produce voltage, current, or resistance or the like in response to measurements of pressure, temperature, volume, flow, distance, or the like. Control circuit 204 orchestrates the flow of address, data, and control signals through a system of hardware architecture under software control to produce an output 205 for evaluating continuously changing analog signals 202.

Memory 207 contents are initially erased and the system first receives a coarse sample reference 252 and a fine sample reference 253 stored in holding registers 250, 251. Analog to digital converter 206 produces the numerator 203 for a divider 254 while a denominator 255 is produced from the coarse sample reference holding register 250. The resulting quotient 256 from a mathematical division is demultiplexed in a decoder 257 to produce a digital pattern of mutually exclusive logic ones 258 wherein a singular logic one bit resides among a plurality of logic zero bits. Furthermore, a mathematical remainder 259 produced from the division process is applied to one input of a digital comparator 209 while the other input 260 is received from a holding register 251 containing the fine sample reference value 253. While comparing inputs, a memory write pulse 261 is produced when a mathematical remainder 259 of the division process is greater than the fine sample reference value 260 to store signal status 258 representing an analog signal 202.

CHART 1

| | Data IN | CSR | FSR | RMDR | WR | Data OUT |
|---|---|---|---|---|---|---|
| 1 | 01111100 | 32 | 3 | −4 | yes | 00000100 |
| 2 | 01111101 | 32 | 3 | −3 | no | 00001000 |
| 3 | 01111110 | 32 | 3 | −2 | no | 00001000 |
| 4 | 01111111 | 32 | 3 | −1 | no | 00001000 |
| 5 | 10000000 | 32 | 3 | 0 | no | 00001000 |
| 6 | 10000001 | 32 | 3 | +1 | no | 00001000 |
| 7 | 10000010 | 32 | 3 | +2 | no | 00001000 |
| 8 | 10000011 | 32 | 3 | +3 | no | 00001000 |
| 9 | 10000100 | 32 | 3 | +4 | yes | 00010000 |
| 10 | 10011111 | 32 | 0 | −1 | yes | 00001000 |
| 11 | 10100000 | 32 | 0 | 0 | no | 00010000 |
| 12 | 10100001 | 32 | 0 | +1 | yes | 00100000 |

Chart 1 further illustrates how a write (WR) signal is generated in relationship with the Coarse Sample Reference (CSF), the Fine Sample Reference (FSR), and the remainder (RMDR) of a mathematical operation with respect to writing data (Data OUT) to the memory based upon raw data input (Data IN) to the numerator of said mathematical operation. In lines one through 12, for example, Data IN depicts an 8-bit data word as the numerator of a mathematical division where the CSF value is the divisor of said mathematical division and the FSR value is used to invoke a write process based upon the RMDR of said mathematical division that stores Data OUT in the memory. The memory write signal modifies the Data OUT solely based upon reconfigurable values for the CSR and FSR register contents. It should become immediately apparent to one skilled in the art to recognize within the illustration how the WR signal can be used for isolating one or more digital patterns to characterize an analog signal applied to input 202. As FIG. 2 further illustrates, the Memory 207 locations are addressed through address lines 213 through a counter 262 in sequence with a multiplexer within ADC 206 to synchronize analog inputs with signal status stored in memory 207. Control circuit 204 meanwhile reads signal status in the form of user-defined signal elements 275 from memory 207 for evaluating continuously changing analog signals 202 applied to ADC 206. By-passing or eliminating ADC 206 will permit digital (raw data) patterns to interface with the filter process directly.

Figure 3:
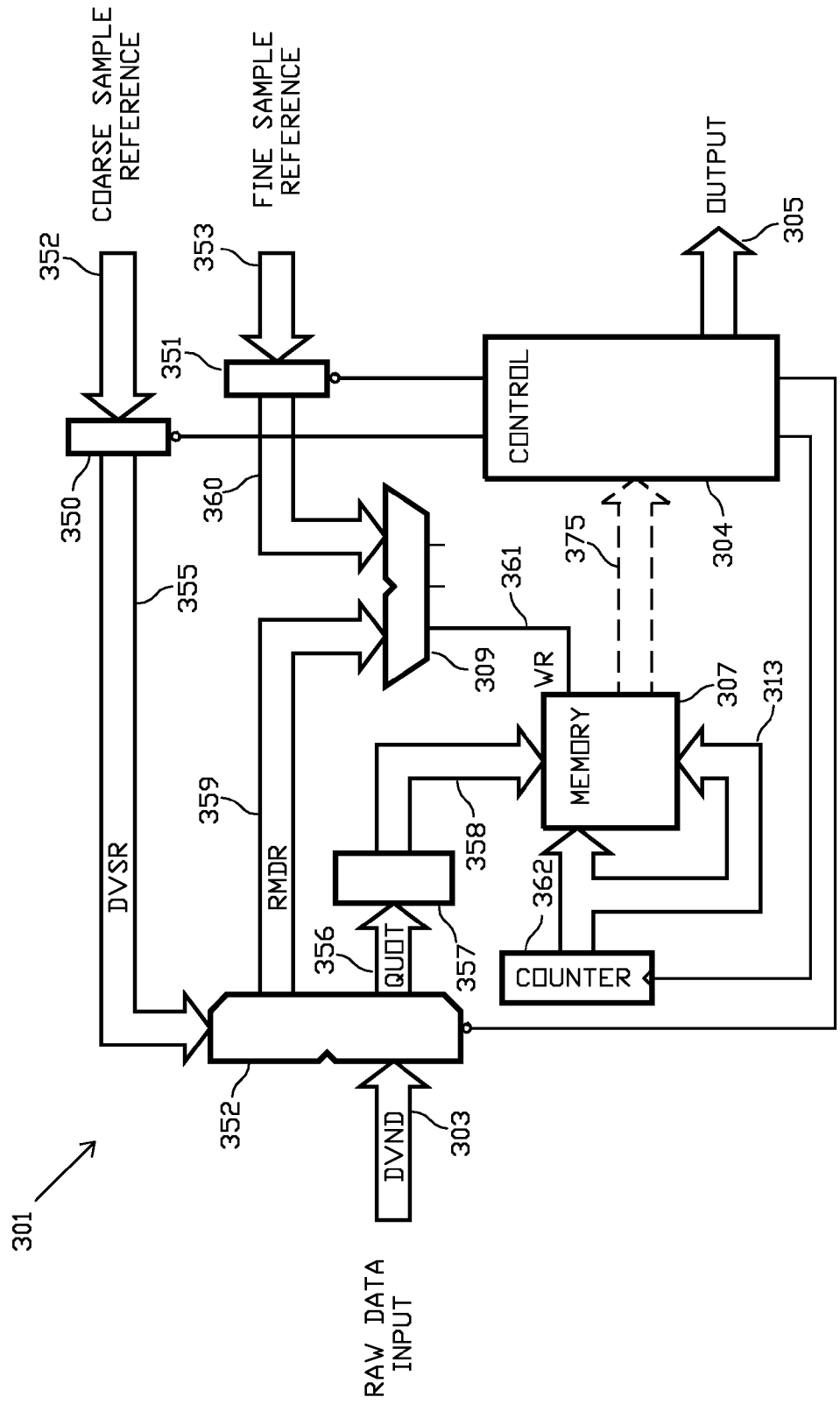
FIG. 3 illustrates of a signal converter system that employs a configuration of re-definable variables to detect digital pattern changes in accordance with embodiments of the present invention.

FIG. 3 illustrates another embodiment of a signal converter system for digital signal detection without an ADC for detecting digital signals and signal changes with re-definable variables to provide independent control over the number of detectable elements of a signal and the level of change that must be observed before signal detection can occur. A digital comparator 301 receives a continuously changing digital signal 303 from an external signal source. A control circuit 304 is used to orchestrate the flow of various signals through a system of processes to produce some useful output 305. Memory 307 contents are initially erased and the system first receives a coarse sample reference 352 and a fine sample reference 353 stored in holding registers 350, 351. Raw data from a signal source is the numerator 303 to a mathematical divider 354 while the denominator 355 is produced from the coarse sample reference holding register 350. The resulting quotient 356 from a mathematical division is demultiplexed in a decoder 357 to produce a digital pattern of mutually exclusive logic ones 358. Furthermore, a mathematical remainder 359 produced from the division process is applied to one input of a digital comparator 309 while the other input 360 to the digital comparator 309 is received from a holding register 351 containing the fine sample reference value. While comparing inputs, a memory write pulse 361 is produced when a mathematical remainder 359 of the division process is greater than the fine sample reference value 360 to store signal status 358 representing a digital signal source pattern 303. Chart 1 further illustrates how a write (WR) signal is generated in relationship with the Coarse Sample Reference (CSF), the Fine Sample Reference (FSR), and the remainder (RMDR) of a mathematical operation with respect to writing data (Data OUT) to the memory based upon raw data input (Data IN) to the numerator of said mathematical operation. In lines one through 12, for example, Data IN depicts an 8-bit data word as the numerator of a mathematical division where the CSF value is the divisor of said mathematical division and the FSR value is used to invoke a write process based upon the RMDR of said mathematical division that stores Data OUT in the memory. The memory write signal modifies the Data OUT solely based upon reconfigurable values for the CSR and FSR register contents. It should become immediately apparent to one skilled in the art to recognize within the illustration how the WR signal can be used for isolating one or more digital patterns to characterize a signal applied to input 303. As FIG. 3 further illustrates, the Memory 307 locations are addressed 313 through a counter 362 in sequence with a number of digital signals to synchronize digital inputs with signal status stored in memory 307. The control circuit 304 meanwhile, reads the memory 307 for instant access to signal status in the form of user-defined signal elements 375 that represents raw data 303 to produce output 305.

Figure 4:
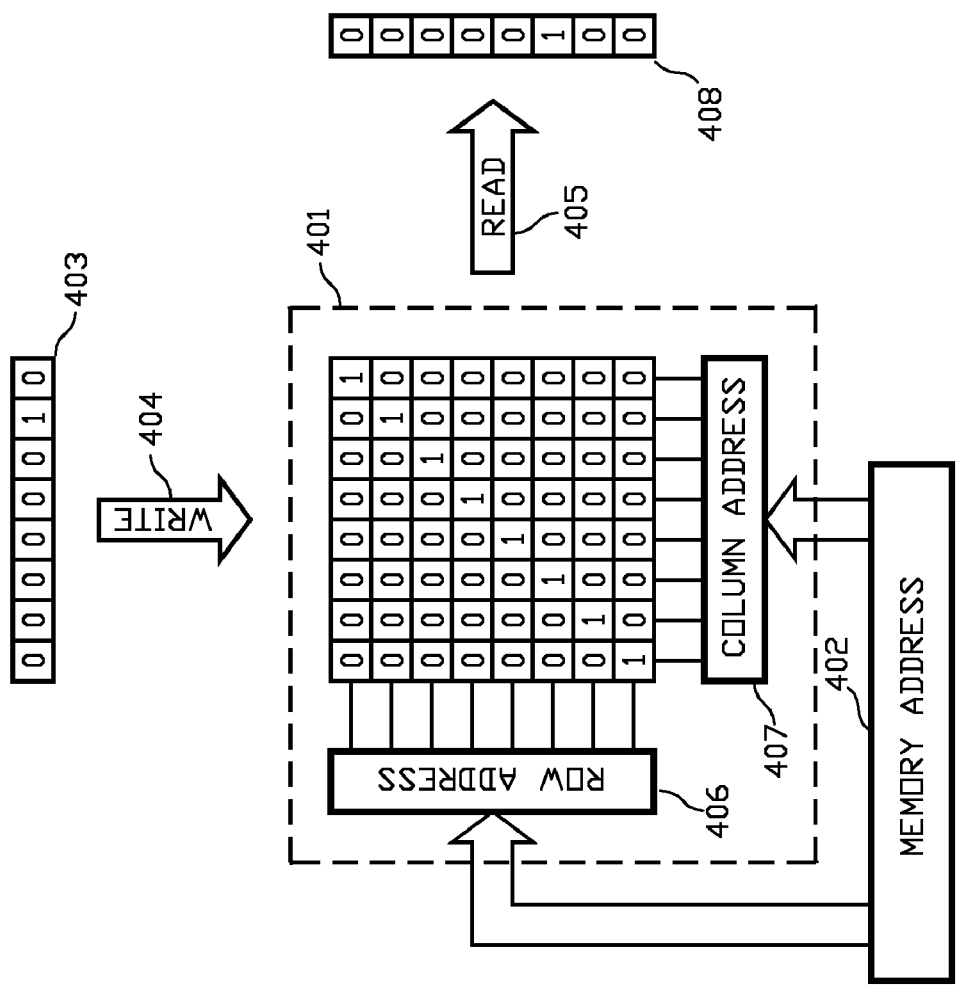
FIG. 4 illustrates of a signal converter system to encode re-definable data elements into bit-mapped data segments for real-time access and signal probing in accordance with embodiments of the present invention.

FIG. 4 illustrates another embodiment of a signal converter system to encode re-definable data elements into bit-mapped data segments in memory for real-time access. Storage cells of a memory device 401 are used to read 405 and write 404 continuously changing signal patterns through a process that utilizes memory address 402 to reference status for specific inputs 403 or particular signal values 408 through an array of rows 406 and columns 407. Row addresses index signal sources by input such as analog signal 202 of FIG. 2 or raw data patterns 303 of FIG. 3, for example. Column addresses index specific signal elements 408 with respect to a configuration of re-definable variables 252 and 253 of FIG. 2 or 352 and 353 of FIG. 3. Status for specific inputs or signal values may be read at will from memory by either an internal control circuit such as control circuit 204 of FIG. 2, control circuit 304 of FIG. 3, or an external process of another system through output 205. The approach of FIG. 4 accomplishes real-time probing of signal status through data segments representing the combined elements of a referenced signal, a specific signal level and a judgment against re-definable variables of a process. Moreover, the relationship between memory data segments, coarse sample reference, and fine sample reference may be further expanded upon by introducing new sample references to the process.

Figure 5:
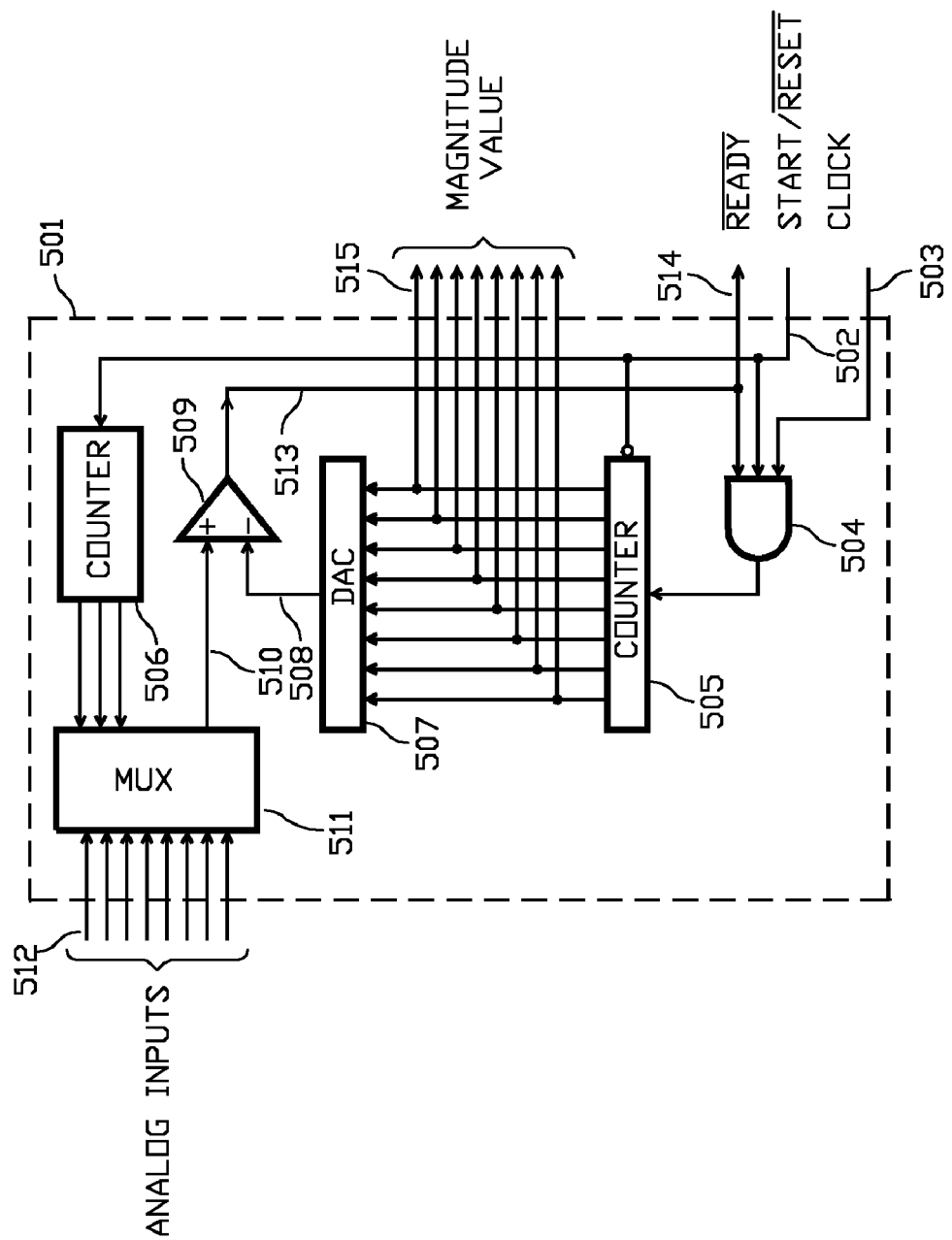
FIG. 5 illustrates an analog to digital converter that can be used in a signal converter system to convert analog signals into digital magnitude values in accordance with embodiments of the present invention.

FIG. 5 illustrates an analog-to-digital converter 501 that can be used in a signal converter system for signal detection. When the start/reset 502 signal is at a logic level of zero, a first counter 505 is cleared and a second counter 506 is rolled over from the last count to the next. While a constant clock 503 signal is applied to the circuit, the start/reset 502 signal toggles from a logic zero (reset condition) to a logic one (start condition). The clock 503 signal is allowed to pass through a logic gate 504 which advances the contents of first counter 505. A digital-to-analog converter converts the output of the first counter to a reference voltage 508 applied to the reference pin of a device 509 synonymous with a biased differential amplifier, level detector, or analog comparator. Meanwhile, the second counter 506 controls the input select pins of the multiplexer 511 to route a selected analog input signal to the signal input 510 of the comparator 509. The comparator then judges an analog signal 510 against a reference voltage 508 to produce an output 513. As clock 503 signals toggle in, the first counter 505 increments in value producing an increase in reference voltage 508 to the comparator 509. The reference voltage 208 continues to increase with each clock 503 pulse until the reference 508 and signal 510 voltages on the comparator 509 match. Upon that occurrence, a logic zero is produced on the output 513 which disables the clock 503 from passing through the logic gate 504 while also signaling 514 to an external control circuit that a signal conversion 515 is complete. The process is repeated for all analog input signals 512.

Figure 6:
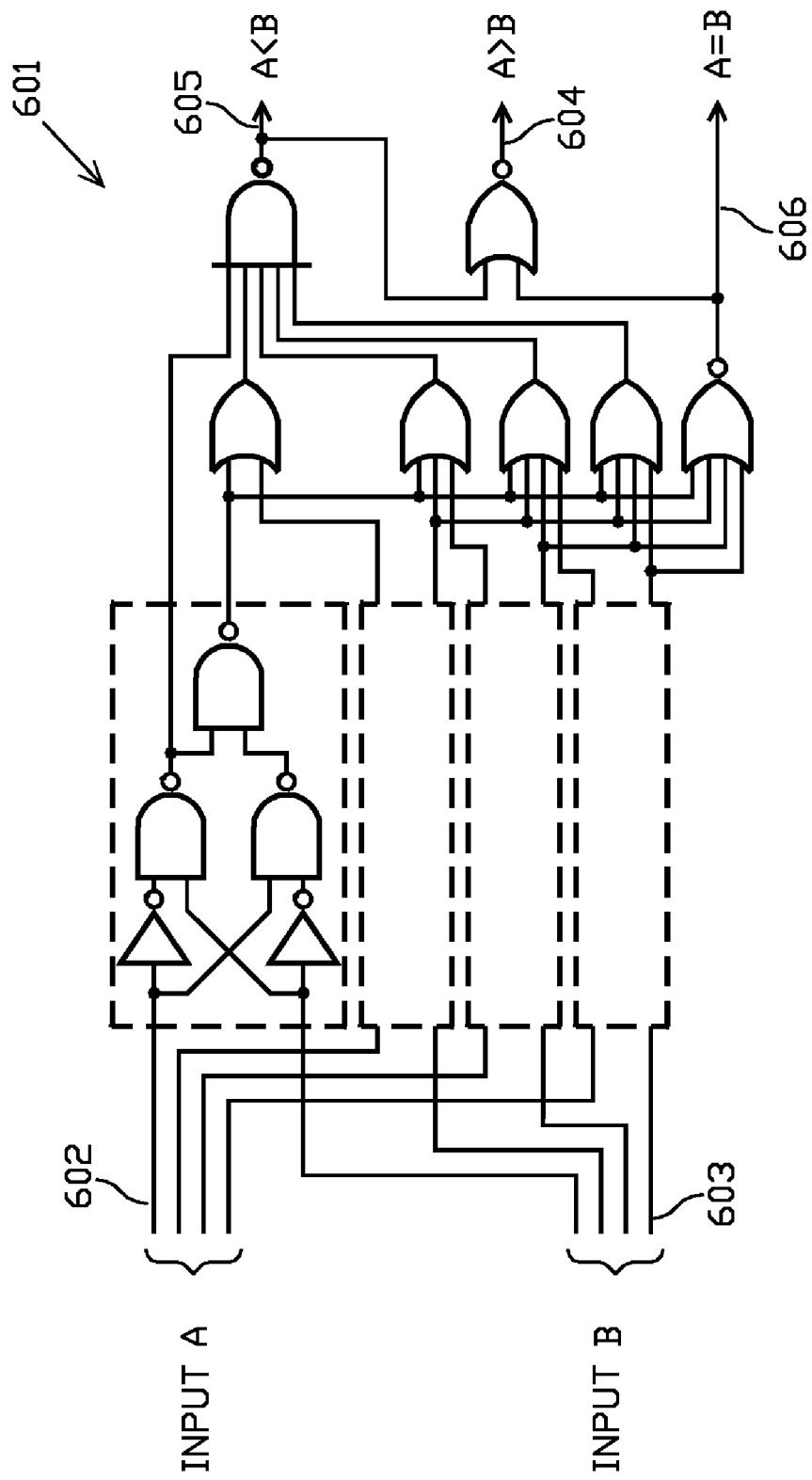
FIG. 6 illustrates a digital comparator that can be used in a signal converter system to judge one input against another in accordance with embodiments of the present invention.

FIG. 6 illustrates a digital comparator that can be used in a signal converter system to judge one input against another. The comparator 601 judges one input 602 source signal against another input 603 reference signal to produce outputs when one input 602 is greater than 604, less than 605 or equal 606 to the other input 603.

Figure 7:
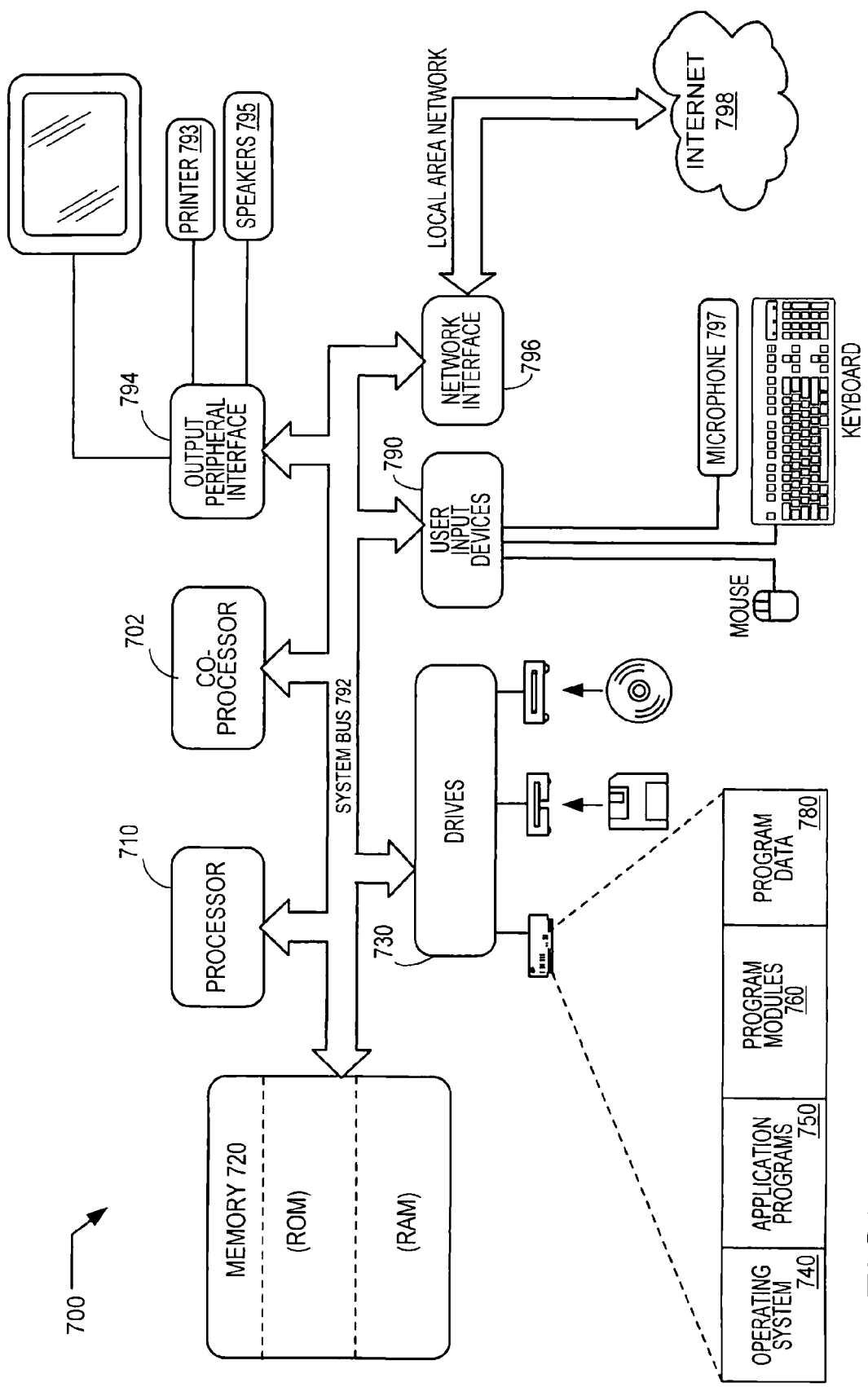
FIG. 7 illustrates a computing system that can be used to implement a co-processor in accordance with embodiments of the present invention.

Referring now to FIG. 7, an embodiment is directed to implementing the data processor as a co-processor. Specifically, FIG. 7 depicts a computing system 700 for implementing an embodiment implementing a co-processor 702. FIG. 7 includes a computer 700, including a processor 710, co-processor 702, memory 720 and one or more drives 730. The drives 730 and their associated computer storage media, provide storage of computer readable instructions, data structures, program modules and other data for the computer 700. Drives 730 can include an operating system 740, application programs 750, and program modules 760. Computer 700 further includes user input devices 790 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be connected to processor 710 and co-processor 702 through a user input interface that is coupled to a system bus 792, but may be connected by other interface and bus structures, such as a parallel port, game port or a universal serial bus (USB). Computers such as computer 700 may also include other peripheral output devices such as speakers, which may be connected through an output peripheral interface 794 or the like.

Computer 700 may operate in a networked environment using logical connections to one or more computers, such as a remote computer connected to network interface 796 The remote computer may be a personal computer, a server, a router, a network PC, a peer device or other common network node, and can include many or all of the elements described above relative to computer 700. Networking environments are commonplace in offices, enterprise-wide computer networks, intranets and the Internet. For example, in the subject matter of the present application, computer 700 may comprise the source machine from which data is being migrated, and the remote computer may comprise the destination machine or vice versa. Note however, that source and destination machines need not be connected by a network 798 or any other means, but instead, data may be migrated via any media capable of being written by the source platform and read by the destination platform or platforms. When used in a LAN or WLAN networking environment, computer 700 is connected to the LAN through a network interface 796 or an adapter. When used in a WAN networking environment, computer 700 typically includes a modem or other means for establishing communications over the WAN, such as the Internet or network 798 It will be appreciated that other means of establishing a communications link between the computers may be used.

According to one embodiment, computer 700 is connected in a networking environment such that the co-processor 702 can perform in accordance with embodiments herein. Specifically, co-processor 702 can operate as a signal converter system of FIG. 3 to encode re-definable data elements into bit-mapped data segments in memory for real-time access. Co-processor 702 can include storage cells such as that of a memory device 401 of FIG. 4 to read 405 and write 404 continuously changing signal patterns received through a system bus through a process that utilizes memory address 402 to reference status for specific inputs 403 or particular signal values 408 through an array of rows 406 and columns 407. Row addresses can index signal sources by input such as raw data patterns 303 of FIG. 3, for example via a user input interface, a network interface or via an adapter connected to computer system 700. Column addresses index specific signal elements 408 with respect to a configuration of re-definable variables 252 and 253 of FIG. 2 or 352 and 353 of FIG. 3 that can be read via a user interface to computer system 700. Status for specific inputs or signal values may be read at will from memory by either an internal control circuit such as control circuit 204 of FIG. 2, control circuit 304 of FIG. 3, or an external process of another system through output 205 which can be coupled to computer system 700. Specifically, computer system 700 can be configured to receive digital representation of raw data patterns via a user interface, network interface or the like and output to processor 710. The raw data patterns can be input and output using system bus 792 via network interface 796, user input devices 790 and/or over internet 798.

While the subject matter of the application has been shown and described with reference to particular embodiments thereof, it will be understood by those skilled in the art that the foregoing and other changes in form and detail may be made therein without departing from the spirit and scope of the subject matter of the application, including but not limited to additional, less or modified elements and/or additional, less or modified blocks performed in the same or a different order.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.)

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into comprehensive devices and/or processes and/or systems via a reasonable amount of experimentation. Those having skill in the art will recognize that examples of such comprehensive devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc.); or (g) a wired/wireless services entity such as Sprint, Cingular, Nextel, etc.), etc.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A method for processing a plurality of data elements, the method comprising:
   receiving the plurality of data elements;
   decoding the plurality of data elements in a decoder to produce a digital pattern of mutually exclusive logic one bit states;
   receiving a coarse sample reference and a fine sample reference and the digital pattern of mutually exclusive logic one bit states for storage in a memory array; and
   processing the data elements to provide an output independent of a decompression process wherein the memory array includes registers for holding the coarse sample reference and the fine sample reference and the plurality of data elements includes raw data from a signal source used as a numerator to a mathematical divider, and the coarse sample reference operates a denominator to the mathematical divider, a quotient from the mathematical divider being demultiplexed in a decoder to produce the digital pattern of mutually exclusive logic one bit states.

2. The method of claim 1 wherein receiving the plurality of data elements is via an analog to digital converter configured to provide a digital representation of the plurality of data elements to the decoder.

3. The method of claim 1 further comprising:
   producing a memory write pulse when a mathematical remainder of a division process is greater than the fine sample reference to store a signal status representing a digital signal source pattern for the plurality of data elements.

4. The method of claim 1 further comprising:
   addressing one or more memory locations in the memory array in sequence with the plurality of data elements to synchronize digital inputs with a signal status stored in the memory array.

5. The method of claim 4 wherein the addressing the one or more memory locations in the memory array in sequence is via a counter coupled to the memory array.

6. The method of claim 1 further comprising:
   enabling real-time probing of signal status of the plurality of data elements via selecting a memory location containing a data element from the plurality of data elements associated with the received data elements.

7. The method of claim 1 further comprising:
   receiving one or more additional sample references to expand a reference relationship between the coarse sample reference and the fine sample reference.

8. The method of claim 1 wherein the fine sample reference and the coarse sample reference are re-definable to provide independent control over a number of observable signal elements and to provide independent control over the level of change that must be observed before detection can occur.

9. A data processor comprising:
   a decoder configured to receive a plurality of changing digital signals, the decoder configured to provide a digital pattern of mutually exclusive logic one bit states;
   a memory circuit coupled to the decoder, the memory circuit configured to receive
   a coarse sample reference and a fine sample reference and the digital pattern of mutually exclusive logic ones wherein the coarse sample reference is a re-definable coarse sample reference to provide independent control over the plurality of changing digital signals; and
   a control circuit coupled to the analog to digital converter, the memory circuit and configured to receive the coarse sample reference and the fine sample reference, and one or more of an address, data and/or control signals, the control circuit configured to process data to provide an output independent of a decompression process.

10. The data processor of claim 9 wherein the independent control over the plurality of changing digital signals is an inherent software filter.

11. The data processor of claim 9 wherein the fine sample reference is configured to provide independent control over a level of change required for detection of a change in the plurality of changing digital signals.

12. The data processor of claim 9 wherein the memory circuit is configured as a bit-mapped memory data array to provide access to specific information concerning electrical behavior of raw data patterns in the plurality of changing digital signals.

13. The data processor of claim 9, wherein the decoder configured to receive a plurality of changing digital signals is configured to receive a plurality of changing digital signals from an analog signal source via an analog to digital converter.

14. The data processor of claim 9, wherein the control circuit coupled to the analog to digital converter, the memory circuit and configured to receive the coarse sample reference and the fine sample reference, and one or more of an address, data and/or control signals, the control circuit configured to process data to provide an output independent of a decompression process is further configured to process the digital pattern of mutually exclusive logic states to determine the output.

15. The data processor of claim 14 wherein the output consists of one or more of a control bit and/or an input for further processing.

16. The data processor of claim 9, further comprising a mathematical divider configured to receive raw data from a signal source used as a numerator to the mathematical divider, and the coarse sample reference as a denominator to the mathematical divider, a quotient from the mathematical divider being demultiplexed in the decoder to produce the digital pattern of mutually exclusive logic states.

17. The data processor of claim 9 wherein the memory circuit is further configured to produce a memory write pulse when a mathematical remainder of a division process is greater than the fine sample reference, the memory circuit configured to store a signal status representing a digital signal source pattern associated with the plurality of changing digital signals.

18. The data processor of claim 9 wherein the memory circuit is further configured to include a plurality of memory locations addressable via a counter in sequence with a number of digital signals to synchronize a plurality of digital inputs with a signal status stored in the memory circuit.

19. The data processor of claim 9 wherein the control circuit is configured to read the memory circuit for an instant signal status of raw data.

20. A method for processing a plurality of signal elements, the method comprised of;
receiving the plurality of signal elements;
receiving a plurality of unprocessed raw data patterns and a coarse sample reference at an arithmetic divider to generate a predetermined number of equal sub-divided parts for signal data patterns and a mathematical remainder for assessing specific variations or gaps between the predetermined number of equal sub-divided parts for signal data patterns;
producing a memory write control signal by a digital comparator;
receiving a raw data status at a decoder/demultiplexer, the raw data status representing one or more signal elements for generating a bit pattern mutually exclusive of logic one bit states;
receiving a coarse sample reference for defining the predetermined number of equal sub-divided parts for signal data patterns;
receiving a fine sample reference for defining specific variations or gaps between the number of equal sub-divided parts for signal data patterns;
storing the coarse sample references and the fine sample reference in a memory, the memory including a bit-mapped data away of one or more assigned logical bit locations defined by rows for representing one or more signal sources and by columns representing one or more signal elements further defined by the coarse sample reference and the fine sample reference; and
accessing via a control circuit the one or more assigned logical bit locations defined by rows representing the one or more signal sources and by columns representing the one or more signal elements further defined by the coarse sample reference and the fine sample reference.

21. The method of claim 20 wherein the one or more signal elements are represented by boolean data types defined by the course sample reference value, the fine sample reference value, and the memory location for storing boolean data types (signal elements) in the data array of row and columns wherein a data array comprises:
a row address represents multiple signal elements from specific signal sources;
a column address represents multiple signal sources for specific signal elements;
a digital word is written to represent specific signal elements from specific signal sources;
a digital word is read to represent multiple signal sources for specific signal elements;
a digital word is read to represent specific signal elements from specific signal sources; and
a digital bit is read as a boolean data type to represent a signal element from a signal source and/or a signal source from a signal element.

22. The method of claim 20 wherein an analog-to-digital converter receives the one or more signal elements.

23. The method of claim 20 wherein a digital comparator receives the fine sample reference to define one or more variations or gaps between the predetermined number of equal sub-divided parts for signal data patterns.

24. The method of claim 20 wherein the digital comparator receives the mathematical remainder of the arithmetic divider to generate a memory write control signal for storing a bit pattern mutually exclusive of logic one bit states in the memory data array of row and column addresses.

25. The method of claim 20 wherein the digital comparator generates a memory write control signal for storing a bit pattern mutually exclusive of logic one bit states in a memory data away of row and column addresses.

26. The method of claim 20 wherein a memory receives a bit pattern mutually exclusive of logic one bit states from the decoder/demultiplexer.

27. The method of claim 20 wherein a memory receives a write control signal from the digital comparator for storing a bit pattern mutually exclusive of logic one bit states in the memory data array of row and column addresses.

28. A data processor for processing a plurality of signal elements, the data processor comprising:
an arithmetic divider receiving unprocessed raw data patterns and the coarse sample reference to generate a predetermined number of equal sub-divided parts for signal data patterns and a mathematical remainder for assessing specific variations or gaps between the predetermined number of equal sub-divided parts for signal data patterns;
a digital comparator for producing a memory write control signal;
a decoder/demultiplexer receiving raw data status representing specific signal elements for generating a bit pattern mutually exclusive of logic one bit states;
a memory comprising a bit-mapped data away of assigned logical bit locations defined by rows for representing specific signal sources and by columns representing specific signal elements further defined by a coarse sample reference and a fine sample reference; and
a control circuit for accessing assigned logical bit locations defined by rows representing specific signal sources and by columns representing specific signal elements further defined by a coarse sample reference and a fine sample reference.

29. The data processor of claim 28 wherein signal elements are represented by boolean data types defined by the course sample reference value, the fine sample reference value, and the memory location for storing boolean data types (signal elements) in the data array of row and columns wherein a data away comprises:
a row address represents multiple signal elements from specific signal sources;
a column address represents multiple signal sources for specific signal elements;
a digital word is written to represent specific signal elements from specific signal sources;
a digital word is read to represent multiple signal sources for specific signal elements;
a digital word is read to represent specific signal elements from specific signal sources; and a digital bit is read as a boolean data type to represent a specific signal element from a specific signal source and/or a specific signal source for a specific signal element.

30. The data processor of claim 28 wherein an analog-to-digital convener receives a plurality of signal elements.

31. The data processor of claim 28 wherein a digital comparator receives the fine sample reference to define specific variations or gaps between the predetermined number of equal sub-divided parts for signal data patterns.

32. The data processor of claim 28 wherein the digital comparator receives the mathematical remainder of the arithmetic divider to generate the memory write control signal for storing a bit pattern mutually exclusive of logic one bit states in the memory data array of row and column addresses.

33. The data processor of claim 28 wherein the digital comparator generates the memory write control signal for storing a bit pattern mutually exclusive of logic one bit states in the memory data away of row and column addresses.

34. The data processor of claim 28 wherein a memory receiving a bit pattern mutually exclusive of logic one bit states from the decoder/demultiplexer.

35. The data processor of claim 28 wherein a memory receives the write control signal from the digital comparator for storing a bit pattern mutually exclusive of logic one bit states in the memory data array of row and column addresses.

\* \* \* \* \*